United States Patent
Matsumura et al.

(10) Patent No.: US 7,712,650 B2
(45) Date of Patent: May 11, 2010

(54) METHOD OF MOUNTING A SEMICONDUCTOR CHIP

(75) Inventors: Takayoshi Matsumura, Kawasaki (JP); Kenji Kobae, Kawasaki (JP); Norio Kainuma, Kawasaki (JP); Kimio Nakamura, Kawaki (JP)

(73) Assignee: Fujitsu Limited, Kawasaki (JP)

( * ) Notice: Subject to any disclaimer, the term of this patent is extended or adjusted under 35 U.S.C. 154(b) by 463 days.

(21) Appl. No.: 11/356,176

(22) Filed: Feb. 17, 2006

(65) Prior Publication Data

US 2007/0080190 A1    Apr. 12, 2007

(30) Foreign Application Priority Data

Oct. 11, 2005   (JP) .............................. 2005-296483

(51) Int. Cl.
 *B23K 1/06* (2006.01)

(52) U.S. Cl. ............................... 228/110.1; 228/180.22

(58) Field of Classification Search ............... 228/110.1
See application file for complete search history.

(56) References Cited

U.S. PATENT DOCUMENTS 6,756,686 B2   6/2004  Iwasaki et al.
7,350,685 B2 *  4/2008  Matsumura et al. ...... 228/110.1
2003/0057537 A1 *  3/2003  Iwasaki et al. ............. 257/684

FOREIGN PATENT DOCUMENTS

| JP | 2002-94241 | 3/2002 |
|---|---|---|
| JP | 2003-100803 | 4/2003 |
| JP | 2004-311637 | * 11/2004 |

* cited by examiner

*Primary Examiner*—Jessica L. Ward
*Assistant Examiner*—Nicholas P D'Aniello
(74) *Attorney, Agent, or Firm*—Kratz, Quintos & Hanson, LLP

(57) ABSTRACT

When a semiconductor chip is mounted using ultrasonic vibration, a method of mounting makes it possible to bond the semiconductor chip and bonding patterns with sufficient bonding strength without making the construction of a circuit board complex. The method of mounting a semiconductor chip causes ultrasonic vibration to act on the semiconductor chip to mount the semiconductor chip on a circuit board by flip-chip bonding. As the circuit board, a circuit board is used where protrusion patterns are provided at positions on bonding patterns to which the semiconductor chip is bonded corresponding to antinodes of vibration for a case where the bonding patterns resonate due to ultrasonic vibration applied by the semiconductor chip.

5 Claims, 4 Drawing Sheets

METHOD OF MOUNTING A SEMICONDUCTOR CHIP

BACKGROUND OF THE INVENTION

1. Field of the Invention

The present invention relates to a method of mounting a semiconductor chip, and in particular to a method of mounting a semiconductor chip by flip-chip bonding using ultrasonic vibration.

2. Related Art

When mounting a semiconductor chip onto a circuit board by flip-chip bonding, a method of mounting that applies ultrasonic vibration to the semiconductor chip is carried out. When mounting a semiconductor chip using ultrasonic vibration, there is a known problem that the bonding strength of the bonded parts depends on the applied direction of the ultrasound and the arrangement of the wiring patterns (bonding patterns) for mounting that are formed on the circuit board.

FIG. 6 is a plan view showing a state where a semiconductor chip 20 is flip-chip bonded on a circuit board 10 when looking from above, with the arrow showing the direction of vibration for the ultrasound.

FIG. 7A is a cross-sectional view showing one bonding pattern 12 (a bonding pattern in the part A in FIG. 6) whose longitudinal direction is parallel to the direction of vibration (the direction of the arrow) for the ultrasonic vibration, and FIG. 7B is a cross-sectional view showing one bonding pattern 12 (a bonding pattern in the part B in FIG. 6) whose longitudinal direction is perpendicular to the direction of vibration of the semiconductor chip 20.

As shown in FIG. 7A, for a bonding pattern 12 disposed so that the longitudinal direction is parallel with the direction of vibration for the ultrasonic vibration, even if ultrasonic vibration is applied, the bonding pattern 12 resists excitation, and accordingly when flip-chip bonding is carried out, the required frictional force is achieved between the bump 22 and the bonding pattern 12, resulting in increased strength for the bond between the bump 22 and the bonding pattern 12. On the other hand, as shown in FIG. 7B, for a bonding pattern 12 disposed so that the longitudinal direction is perpendicular to the direction of vibration of the ultrasonic vibration, the bonding pattern 12 is susceptible to moving so as to track the ultrasonic vibration, resulting in decreased strength for the bond between the bump 22 and the bonding pattern 12.

In this way, when semiconductor chips are mounted using ultrasonic vibration, to solve the problem of decreased strength for bonds between bumps and bonding patterns disposed with the lengthwise direction perpendicular to the direction of vibration for the ultrasonic vibration, a method (see Patent Document 1) where dummy patterns extend from the bonding patterns in the direction in which the ultrasonic vibration is applied and a method (see Patent Document 2) where via holes are formed on each side of the bonded parts where the bumps are bonded or filled vias are formed below the bonded parts have been proposed.

Patent Document 1
  Japanese Laid-Open Patent Publication No. 2004-311637

Patent Document 2
  Japanese Laid-Open Patent Publication No. 2002-94241

The method where protrusion patterns extend from the bonding patterns described above in a direction in which ultrasonic vibration is applied increases the strength of the bonds between the bonding patterns and the base layer and makes the bonding patterns resistant to excitation when the ultrasonic vibration is applied, resulting in increased strength for the bonds between the bumps and the bonding patterns. However, a method where the protrusion patterns are disposed simply corresponding to the positions on the bonding patterns at which the bumps are bonded is not thought to be effective in view of the case where the bonding patterns resonate due to the ultrasonic vibration applied to mount the semiconductor chip.

With the method where the formation positions of the via holes are adjusted relative to the bonding patterns, there are the problems that the construction of the circuit board becomes complex and limitations are placed on the designs of components due to the via holes being formed at predetermined positions.

SUMMARY OF THE INVENTION

The present invention was conceived to solve the problems described above and it is an object of the present invention to provide a method of mounting a semiconductor chip which when mounting a semiconductor chip using ultrasonic vibration can reliably bond the semiconductor chip and the bonding patterns with sufficient bonding strength without a complex construction being required when designing the circuit board.

To achieve the stated object, a method of mounting a semiconductor chip according to the present invention causes ultrasonic vibration to act on the semiconductor chip to mount the semiconductor chip on a circuit board by flip-chip bonding, wherein as the circuit board, a circuit board is used where protrusion patterns are provided on bonding patterns to which the semiconductor chip is bonded at positions corresponding to antinodes of vibration for a case where the bonding patterns resonate due to ultrasonic vibration applied by the semiconductor chip.

In addition, the bonding patterns may be disposed perpendicular to a direction of vibration of the ultrasonic vibration and the protrusion patterns may be provided at least one end in the longitudinal direction of the bonding patterns. Since the ends in the longitudinal direction of the bonding patterns will definitely be antinodes for the vibration, when the bonding pattern resonates, providing the protrusion patterns on the ends of the bonding patterns is effective as a method of suppressing resonance of the bonding patterns.

Also, the bonding patterns may be provided with longitudinal directions thereof disposed perpendicular to a direction of vibration of the ultrasonic vibration and the protrusion patterns may be provided corresponding to positions of antinodes at midpoints of the bonding patterns in the longitudinal direction and not at both ends in the longitudinal direction. That is, it is possible to provide the protrusion patterns at midpoints of the bonding patterns in the longitudinal direction.

In another method of mounting a semiconductor chip according to the present invention, ultrasonic vibration is caused to act on the semiconductor chip to mount the semiconductor chip on a circuit board by flip-chip bonding, wherein the semiconductor chip is mounted on the circuit board by positioning bonding parts of bonding patterns, which are provided on the circuit board and to which the semiconductor chip is bonded, and the semiconductor chip at positions of antinodes that appear when the bonding patterns resonate due to the ultrasonic vibration applied by the semiconductor chip.

In another method of mounting a semiconductor chip according to the present invention, ultrasonic vibration is caused to act on the semiconductor chip to mount the semiconductor chip on a circuit board by flip-chip bonding, wherein as the circuit board, a circuit board is used where lengths of bonding patterns, out of the bonding patterns to which the semiconductor chip is bonded, which are disposed so that longitudinal directions of the bonding patterns are perpendicular to the direction of vibration of the ultrasonic vibration are set at lengths where the bonding patterns do not resonate due to the ultrasonic vibration applied by the semiconductor chip.

As the circuit board, a circuit board may be used where pattern widths of the bonding patterns, which are disposed so that longitudinal directions of the bonding patterns are perpendicular to the direction of vibration of the ultrasonic vibration, are set so that the bonding patterns do not resonate due to the ultrasonic vibration applied by the semiconductor chip or the pattern heights of the bonding patterns are set so that the bonding patterns do not resonate due to the ultrasonic vibration applied by the semiconductor chip.

The method of mounting a semiconductor chip according to the present invention considers a case where bonding patterns formed on a circuit board resonate due to ultrasonic vibration applied from the semiconductor chip, and by using methods that provide bonding patterns with protrusion patterns, position the bonded parts at positions of nodes of vibration of the bonding patterns, and set the length of the bonding pattern so that the bonding patterns do not resonate, increase the strength of the bonds between the semiconductor chips and the bonding patterns. By doing so, it is possible to improve the strength of the bonds between the semiconductor chip and the circuit board without making the construction of the bonding patterns formed on the circuit board 10 and the like complex.

BRIEF DESCRIPTION OF THE DRAWINGS

The aforementioned and other objects and advantages of the present invention will become apparent to those skilled in the art upon reading and understanding the following detailed description with reference to the accompanying drawings.

In the drawings.

DESCRIPTION OF THE PREFERRED EMBODIMENTS

Preferred embodiments of a method of mounting a semiconductor chip according to the present invention will now be described in detail.

First Embodiment

Figure 1:
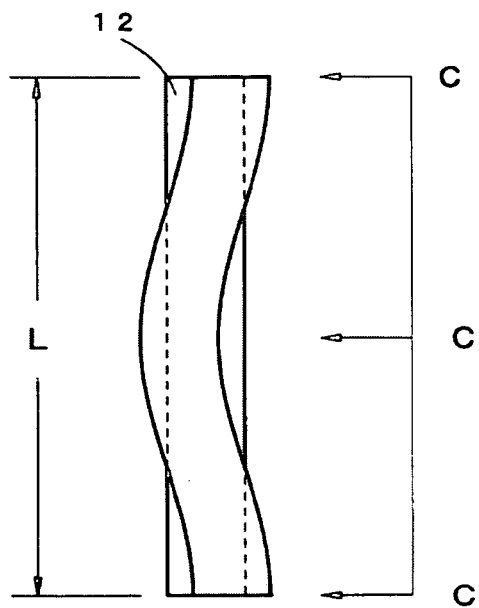
FIG. 1 is a diagram useful in explaining positions of antinodes on a bonding pattern that is resonating due to the action of ultrasonic vibration.
Figure 2A:
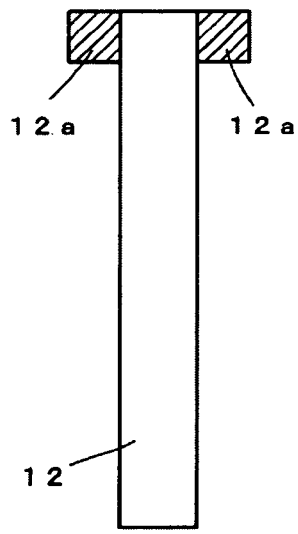
FIGS. 2A to 2C are diagrams useful in explaining an example where protrusion patterns are provided on the bonding patterns.
Figure 2B:
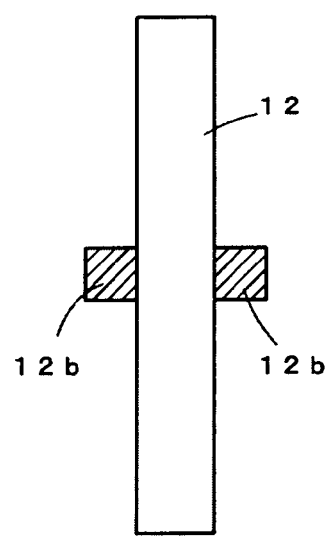
Figure 2C:
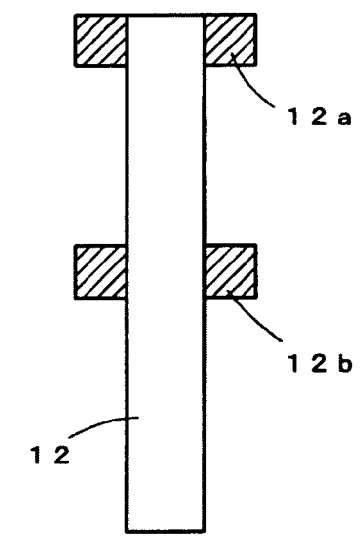
Figure 3:
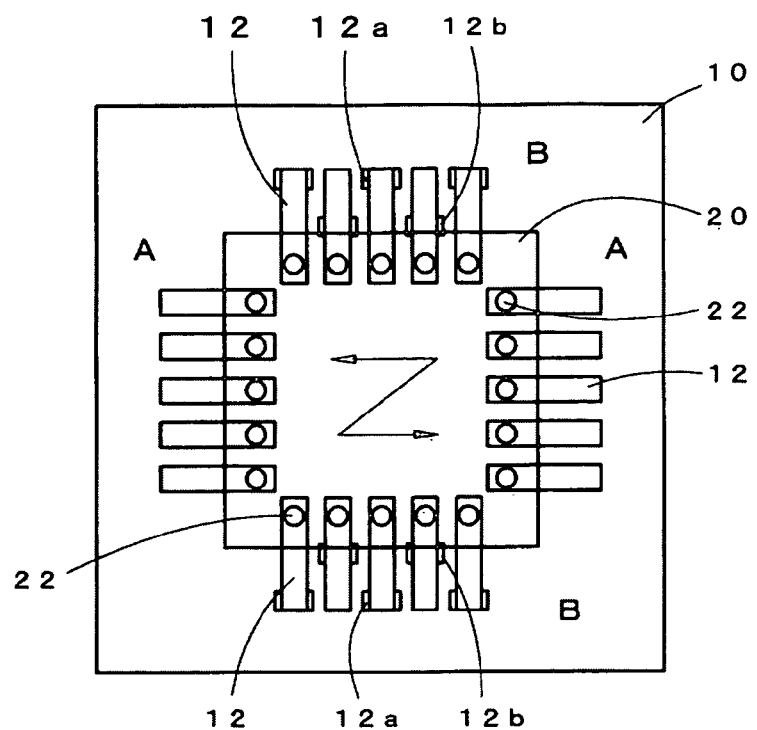
FIG. 3 is a diagram useful in explaining a first embodiment of mounting a semiconductor chip on a circuit board.
Figure 6:
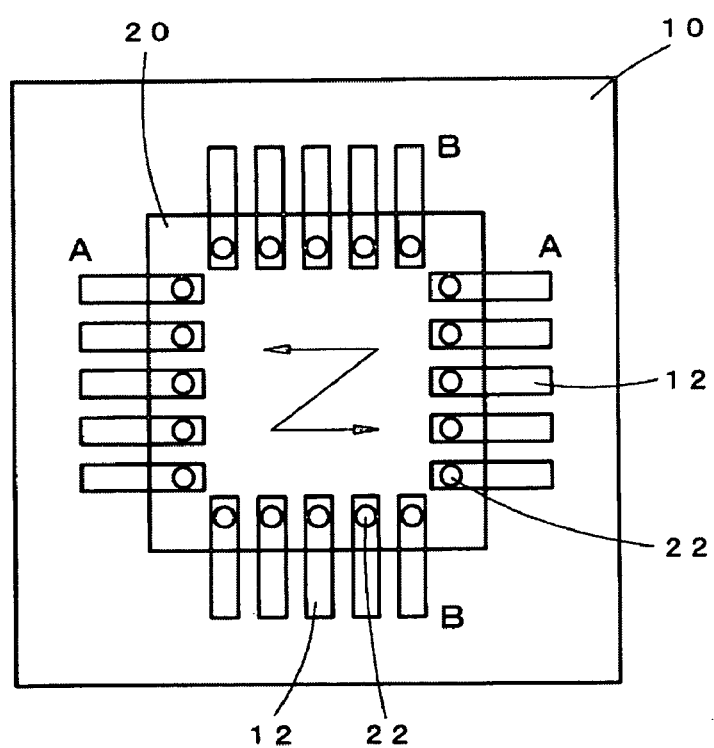
FIG. 6 is a diagram useful in explaining a state where ultrasonic vibration is applied to a semiconductor chip to mount a semiconductor chip to the circuit board.
Figure 7A:
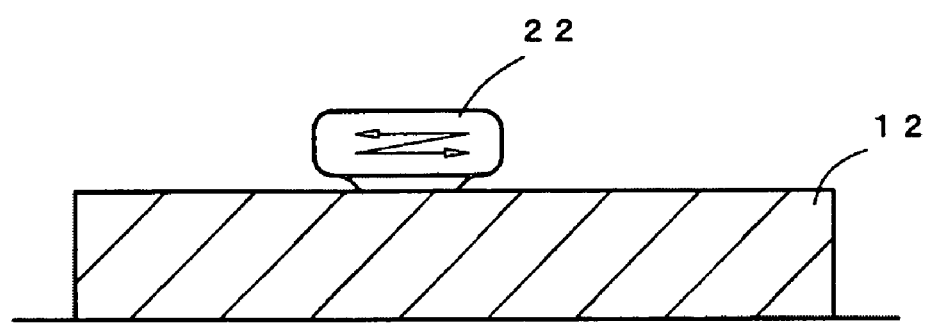
FIGS. 7A and 7B are diagrams useful in explaining the state of bonding patterns when a semiconductor chip is mounted to the circuit board by applying ultrasonic vibration.
Figure 7B:
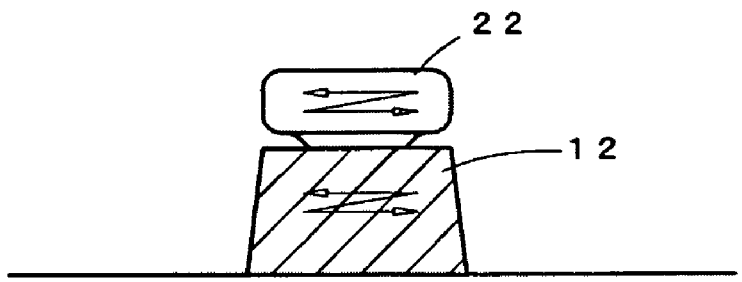

FIGS. 1 to 3 show a first embodiment of the method of mounting a semiconductor chip according to the present invention. FIG. 1 shows, as an example of one bonding pattern 12 formed on a circuit board, a state where ultrasonic vibration is applied to a bonding pattern 12 so that the direction of vibration is perpendicular to the longitudinal direction of the bonding pattern 12. In the same way as the bonding patterns 12 in part B of the circuit board 10 shown in FIG. 6 as the conventional art, the bonding pattern 12 in FIG. 1 is formed with a long narrow planar form.

When ultrasonic vibration is applied to the bonding pattern 12 with the direction of vibration perpendicular to the longitudinal direction of the bonding pattern 12 and the bonding pattern 12 resonates, both ends of the bonding pattern 12 in the longitudinal direction inevitably become antinodes of vibration. FIG. 1 shows the case where antinodes of vibration (C points) are produced at both ends and the center of the bonding pattern 12 when the length of the bonding pattern 12 is equal to one wavelength.

In this way, when ultrasonic vibration whose direction of vibration is perpendicular to the longitudinal direction of the bonding pattern 12 acts upon the bonding pattern 12, the bonding pattern 12 will resonate when the length L of the bonding pattern 12 is an integer multiple of $\lambda/2$ (where $\lambda$ is the wavelength).

When a semiconductor chip is flip-chip bonded using ultrasonic vibration, if the bonding patterns provided on the circuit board resonate, this means that the bonding patterns will vibrate so as to track the movement of the bumps provided on the semiconductor chip. In this case, when looking from the end surface side of a bonding pattern, the bonding pattern moves back and forth so as to be inclined to the left and right. If the bonding patterns resonate when ultrasonic vibration has been applied to the semiconductor chip, the relative displacement between the bumps and bonding patterns will become smaller, and the ultrasonic vibration that acts on the semiconductor chip will not effectively act as a bonding force that causes the bumps and bonding patterns to rub against one another and become bonded, resulting in decreased strength for the bonds between the bumps and bonding patterns.

Accordingly, to raise the bonding strength for the bumps and bonding patterns, when ultrasonic vibration acts on the semiconductor chip, it is necessary to prevent the bonding patterns from resonating. FIGS. 2A and 2B show examples where protrusion patterns 12a, 12b are provided to suppress resonance of the bonding patterns 12. FIG. 2A is an example where the protrusion pattern 12a is provided at one end in the longitudinal direction of the bonding pattern 12, while FIG. 2B is an example where the protrusion pattern 12b is provided at the center in the longitudinal direction of the bonding pattern 12.

These protrusion patterns 12a, 12b are both formed so as to extend sideways from side surfaces of the bonding patterns 12 in accordance with positions of antinodes of vibration when the bonding patterns 12 resonate. The protrusion patterns 12a, 12b are provided at positions of antinodes of vibration for the case where ultrasonic vibration acts on the bonding patterns 12 and results in the bonding patterns 12 resonating since this is the most effective way of suppressing resonance of the bonding patterns 12.

These protrusion patterns 12a, 12b have an object of suppressing vibration of the bonding pattern 12 at the parts that are the antinodes of vibration. Although examples formed so as to extend sideways in rectangular shapes to the sides of the bonding patterns 12 are shown in the drawings, the shapes of the protrusion patterns 12a, 12b are not limited to rectangles. It is also possible for the sizes of the protrusion patterns 12a, 12b to be set appropriately.

When the protrusion pattern 12a for suppressing resonance is provided at ends in the longitudinal direction of the bonding patterns 12, the protrusion pattern 12a may be provided at one end of each bonding pattern 12 or at both ends. Also, as shown in FIG. 2C, protrusion patterns may be provided both at ends in the longitudinal direction of the bonding patterns 12 and in the center in the longitudinal direction of the bonding patterns 12.

FIG. 3 shows the state where the semiconductor chip 20 has been mounted using ultrasonic vibration on the circuit board 10 on which bonding patterns 12 provided with the protrusion patterns 12a, 12b have been formed.

The bonding patterns 12 provided with the protrusion patterns 12a, 12b are the patterns (the patterns on the side marked "B" in FIG. 3) whose longitudinal directions are perpendicular to the direction of vibration of the ultrasonic vibration that acts on the semiconductor chip 20. In the illustrated example, bonding patterns 12 that have a protrusion pattern 12a disposed at one end in the longitudinal direction thereof and bonding patterns 12 that have a protrusion pattern 12b disposed at a center in the longitudinal direction thereof are alternately disposed, with this arrangement preventing the protrusion patterns 12a, 12b of adjacent bonding patterns 12 from interfering with each other.

As shown in FIG. 3, according to a method of flip-chip bonding the semiconductor chip 20 to the circuit board 10, on which the bonding patterns 12 provided with the protrusion patterns 12a, 12b are formed, by applying ultrasonic vibration to the semiconductor chip 20 with the direction of vibration shown in the drawing, excitation of the bonding patterns 12 whose longitudinal directions are perpendicular to the direction of vibration of the ultrasonic vibration is suppressed, and therefore the semiconductor chip 20 can be mounted without a decrease in strength for the bonds between such bonding patterns 12 and the bumps 22. Also, since the required bonding strength for bonding to the bumps 22 is achieved for the bonding patterns 12 whose longitudinal directions are parallel to the direction of vibration of the ultrasonic vibration, all of the bumps of the semiconductor chip 20 are reliably connected to the bonding patterns 12 formed on the circuit board 10.

In the present embodiment, although the case where resonance occurs as shown in FIG. 1 when the ultrasonic vibration acts on the bonding pattern 12 has been described, there are various ways in which the bonding patterns 12 can resonate when ultrasonic vibration acts upon the bonding patterns 12 according to the frequency of the ultrasonic vibration applied to the semiconductor chip and the shapes of the bonding patterns 12. Wiring patterns for leads and vias for connecting between layers are also connected to the bonding pattern 12, which can also affect the type of resonance. In any of such cases, it is always effective to provide the protrusion patterns 12a, 12b so as to be positioned at the positions of the antinodes of vibration when the bonding pattern 12 resonates due to ultrasonic vibration that acts on the semiconductor chip 20. By providing the protrusion patterns 12a, 12b that suppress resonance, resonance of the bonding patterns 12 when the semiconductor chip 20 is mounted is suppressed, and therefore it is possible to improve the strength of the bonds between the bumps 22 of the semiconductor chip 20 and the bonding pattern 12.

Second Embodiment

Figure 4A:
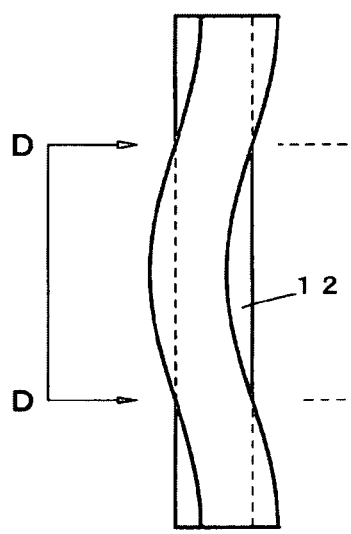
FIGS. 4A to 4C are diagrams useful in explaining positions of nodes on a bonding pattern that is resonating due to ultrasonic vibration that acts thereupon.
Figure 4B:
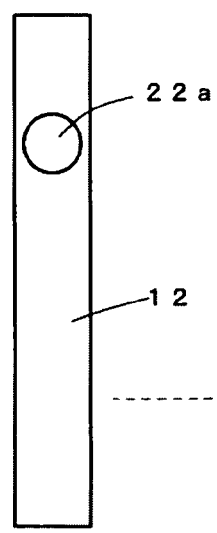
Figure 4C:
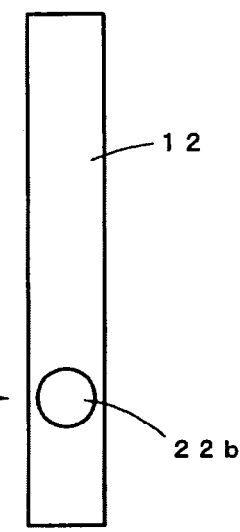
Figure 5:
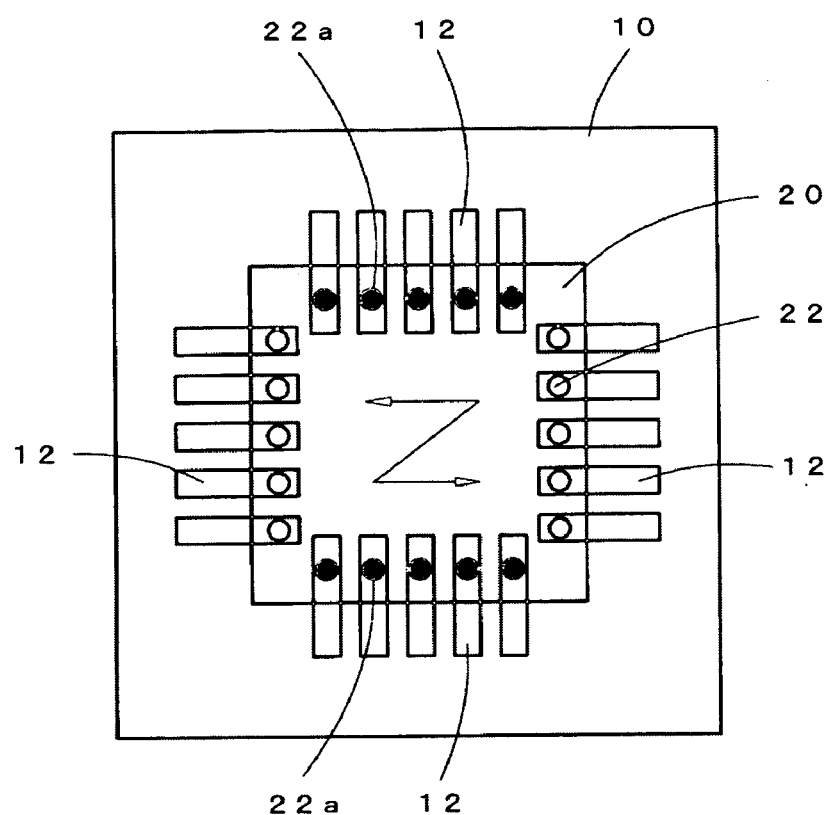
FIG. 5 is a diagram useful in explaining a second embodiment of mounting a semiconductor chip on a circuit board.

FIGS. 4 and 5 show a second embodiment of the method of mounting a semiconductor chip according to the present invention.

FIG. 4A shows a state where ultrasonic vibration is applied to a bonding pattern 12 resulting in the bonding pattern 12 resonating. The D points in FIG. 4A show the positions of the nodes in the state where the bonding pattern 12 resonates. It should be noted that in the illustrated example, the length L of the bonding pattern 12 corresponds to one wavelength.

In the method of mounting a semiconductor chip according to the present embodiment, when ultrasonic vibration is applied to the semiconductor chip 20 to mount the semiconductor chip 20 to the circuit board 10 by flip-chip bonding, the semiconductor chip 20 is mounted so that the bonding positions of the bumps 22 provided on the semiconductor chip 20 are positioned at the positions (D points) of the nodes when the bonding pattern 12 resonates. That is, for the example of the resonance shown in FIG. 4A, mounting is carried out with the bumps 22a, 22b positioned at the positions of the nodes of the bonding pattern 12, as shown in FIGS. 4B and 4C.

FIG. 5 shows a state where during flip-chip bonding of the semiconductor chip 20 to the circuit board 10 by applying ultrasonic vibration to the semiconductor chip 20, mounting is carried out so that the bonding positions of the bumps 22a on the bonding patterns 12 whose longitudinal directions are perpendicular to the direction of vibration of the ultrasonic vibration are set at the positions of nodes of vibration when the bonding patterns 12 resonates.

In this way, when mounting the semiconductor chip 20 by applying ultrasonic vibration to the semiconductor chip 20, by bonding with the bumps 22a positioned at nodes for the resonance of the bonding patterns 12 that are excited and resonate due to the applied ultrasonic vibration, it is possible to improve the strength of the bonds between the bonding pattern 12 and the bumps 22a without the bonding pattern 12 tracking the bumps 22a at the bonding positions of the bumps 22a.

It should be noted that in the present embodiment also, when the semiconductor chip 20 is mounted on the circuit board 10 by ultrasonic vibration that acts on the semiconductor chip 20, the bonding patterns 12 may resonate in various ways depending on the frequency of the ultrasonic vibration applied to the semiconductor chip 20 and the shape of the bonding patterns 12. In reality, the shapes of the bonding patterns 12 formed on the circuit board 10 are designed in accordance with the ultrasonic vibration that acts on the semiconductor chip 20 mounted on the circuit board 10, the planar arrangement of the bumps 22 formed on the semiconductor chip 20 and the like, and the semiconductor chip 20 is mounted so that the bumps 22 are positioned at the positions of the nodes of vibration in the state where the bonding pattern 12 resonates.

Third Embodiment

When applying ultrasonic vibration to the semiconductor chip 20 to mount the semiconductor chip 20 on the circuit board 10, the third embodiment of the method of mounting the semiconductor chip according to the present invention mounts the semiconductor chip 20 by setting the lengths, pattern widths, and pattern heights of the bonding patterns 12 so that the bonding patterns 12 do not resonate due to the ultrasonic vibration.

As one example, if a bonding pattern 12 is shaped so as to be rectangular in planar form as shown in FIG. 1, when the bonding pattern 12 resonates due to the application of ultrasonic vibration in a direction perpendicular to the longitudinal direction of the bonding pattern 12, mounting is carried out with the length L of the bonding pattern 12 set at $(\lambda/2) \times (n+1/2)$ so as to suppress resonance of the bonding pattern 12. It should be noted that n is an integer and $\lambda$ is the wavelength of the resonant frequency.

Since the bonding patterns 12 have a predetermined pattern width and pattern height, when the ultrasonic vibration acts on the bonding pattern 12, there is the possibility of the bonding pattern 12 resonating in the pattern width direction and the pattern height direction. Accordingly, if the wavelengths in the pattern width (W) and pattern height (H) directions for the bonding pattern 12 when the bonding pattern 12 resonates due to applied ultrasonic vibration are expressed as $\lambda_W$ and $\lambda_H$, $W = (\lambda_W/2) \times (n+1/2)$ may be set for the pattern width direction of the bonding pattern 12 and $H = (\lambda_H/2) \times (n+1/2)$ may be set for the pattern height direction.

By setting the length (L), pattern width (W), and pattern height (H) of the bonding patterns 12 in this way, when ultrasonic vibration is applied to the semiconductor chip, resonance is suppressed for the bonding patterns 12 in the length direction and also in the width direction and height direction. Accordingly, the relative displacements of the bumps of the semiconductor chip and the bonding patterns can be reliably maintained when the ultrasonic vibration is applied, which makes it possible to improve the strength of the bonds between the bumps and the bonding patterns.

It should be noted that although methods of bonding the semiconductor chip 20, on which bumps 22 are formed, to the bonding patterns 12 provided on the circuit board 10 have been described for the above embodiments as methods of flip-chip bonding the semiconductor chip 20 to the circuit board 10, the present invention can be applied in exactly the same way to the case where a semiconductor chip is mounted by a method where bumps are provided on the bonding patterns 12 of the circuit board 10 and the bumps of the bonding patterns 12 are bonded to the electrodes of the semiconductor chip.

What is claimed is:

1. A method of mounting a semiconductor chip that causes ultrasonic vibration to act on the semiconductor chip to mount the semiconductor chip on a circuit board by flip-chip bonding, wherein the circuit board has bonding patterns, to which bumps of the semiconductor chip are bonded and each of which has a rectangular planar shape with a longitudinal direction disposed perpendicular to a direction of vibration of the ultrasonic vibration, and protrusion patterns, which are sidewardly extended from side faces of the bonding patterns, the bonding patterns are formed into a prescribed shape so as to go into a resonance state where both ends in the longitudinal direction of the bonding patterns correspond to antinodes of vibration when the ultrasonic vibration is applied, and the protrusion patterns are provided on the bonding patterns at positions corresponding to antinodes of vibration for a case where the bonding patterns resonate due to ultrasonic vibration applied by the semiconductor chip, wherein the bumps are located at positions corresponding to the bonding patterns, from which the protrusion patterns are extended, and the ultrasonic vibration is applied to the semiconductor chip so as to flip-chip-bond the semiconductor chip, and wherein parts of the bonding patterns to which the bumps of the semiconductor chip are bonded are different from longitudinal parts of the bonding patterns at which the protrusion patterns are provided, wherein the protrusion patterns are provided to parts of the bonding patterns located outside of the chip mounting area.

2. A method of mounting a semiconductor chip according to claim 1, wherein the bonding patterns are provided with longitudinal directions thereof disposed perpendicular to a direction of vibration of the ultrasonic vibration and the protrusion patterns are provided at least one end in the longitudinal direction of the bonding patterns.

3. A method of mounting a semiconductor chip according to claim 1, wherein the bonding patterns are provided with longitudinal directions thereof disposed perpendicular to a direction of vibration of the ultrasonic vibration and the protrusion patterns are provided corresponding to positions of antinodes at midpoints of the bonding patterns in the longitudinal direction.

4. A method of mounting a semiconductor chip according to claim 2, wherein the bonding patterns are outwardly extended from an edge of a chip mounting area of the circuit board.

5. A method of mounting a semiconductor chip according to claim 3, wherein the bonding patterns are outwardly extended from an edge of a chip mounting area of the circuit board.

* * * * *